United States Patent [19]

Toms et al.

[11] Patent Number: 5,339,279
[45] Date of Patent: Aug. 16, 1994

[54] BLOCK ERASABLE FLASH EEPROM APPARATUS AND METHOD THEREOF

[75] Inventors: Thomas R. Toms; Ann E. Harwood; Yoshiko K. Inoue; Clinton C. K. Kuo, all of Austin, Tex.

[73] Assignee: Motorola, Inc., Schaumburg, Ill.

[21] Appl. No.: 57,924

[22] Filed: May 7, 1993

[51] Int. Cl.$^5$ .............. G11C 11/34; G11C 7/00; G11C 8/00
[52] U.S. Cl. .............. 365/185; 365/230.03; 365/238.5; 365/218; 365/900
[58] Field of Search .......... 365/218, 900, 185, 230.03, 365/182, 238.5

[56] References Cited

U.S. PATENT DOCUMENTS

| | | | |
|---|---|---|---|
| 4,408,306 | 10/1983 | Kuo | 365/218 |
| 4,412,309 | 10/1983 | Kuo et al. | 365/184 |
| 5,065,364 | 11/1991 | Atwood et al. | 365/218 |
| 5,095,461 | 3/1992 | Miyakawa et al. | 365/184 |
| 5,109,361 | 4/1992 | Yim et al. | 365/218 |
| 5,126,808 | 6/1992 | Montalvo et al. | 357/23.5 |
| 5,130,769 | 7/1992 | Kuo et al. | 357/23.5 |
| 5,185,718 | 2/1993 | Rinerson et al. | 365/218 |
| 5,191,556 | 3/1993 | Radjy | 365/235 |
| 5,199,001 | 3/1993 | Tzeng et al. | 365/218 |
| 5,249,158 | 9/1993 | Kynett et al. | 365/230.03 |
| 5,270,980 | 12/1993 | Pathak et al. | 365/218 |

OTHER PUBLICATIONS

Jinbo, Toshikatsu, et al. "A 5V-Only 16 Mb Flash Memory with Sector-Erase Mode," IEEE 1992, pp. 154–155; 271.

Momodomi, Masaki, et al., "A 4-Mb Nand EEPROM with Tight Programmed Vt Distribution," IEEE Journal of Solid-State Circuits, vol. 26, No. 4, Apr. 1991, pp. 492–496.

Kume, Hitoshi, et al., "A 3.42 um 2 Flash Memory Cell Technology Conformable to a Sector Erase," 1991 Symposium on VLSI Technology, May 28–30, 1991, pp. xi; 77–78.

Onoda, H., et al., "A Novel Cell Structure Suitable for a 3 Volt Operation, Sector Erase Flash Memory," IEEE 1992, pp. 24.3.1–24.3.4.

Yamada, Seiji, et al., "A Self–Convergence Erasing Scheme for a Simple Stacked Gate Flash EEPROM," IEEE 1991, pp. 11.4.1–11.4.4.

Kynett, Virgil N., et al., "An In-System Reprogrammable 32KX8 CMOS Flash Memory," IEEE Journal of Solid–State Circuits, vol. 23, No. 5, Oct. 1988, pp. 1157–1163.

Toshiba America Electronic Components, Inc., Non-Volatile Memory Databook (including part number TC58F100P/F), 1991, pp. 392–429.

Bilal, Nasir, "Nikkei Microdevices," Device: 1M Flash AM29F010 (AMD), Jun. 1992, pp. 72–73.

Motorola, Inc., "Technical Summary 32-Bit Microcontroller," 1992, pp. 1; 100–109.

Toshiba America Electronic Components, Inc., Non-Volatile Memory Databook (including part number TC58F1000/F/J), 1990, pp. cover; G–14 through G–49.

*Primary Examiner*—Viet Q. Nguyen
*Attorney, Agent, or Firm*—Susan C. Hill

[57] ABSTRACT

A block erasable flash EEPROM (22) having a single array (68) which can be partitioned into one or more blocks (50–57). The same column decode/block select circuitry (66) is used to provide both column select signals (71) and block select signals (73). The number of blocks (50–57) and the size of each block (50–57) can be determined by the manufacturer during the manufacturing process. Each block (50–57) has a corresponding charge pump (80–87). Each charge pump (80–87) is capable of erasing a single block within the array (68). Each charge pump (80–87) has a variable capacitor (90–97). Each of the variable capacitors (90–97) can be sized according to the size of its corresponding block (50–57).

20 Claims, 6 Drawing Sheets

| ADDRESS VALUES | | | | | | | BLOCK(S) TO BE ERASED IN ARRAY 68 |
|---|---|---|---|---|---|---|---|
| A31–A9 | A8–A6 | A5 | A4 | A3 | A2 | A1 | A0 | |
| BASE ADDRESS OF BLOCK ERASABLE FLASH EEPROM 22 | X | 1 | 0 | 0 | 0 | X | X | BLOCK 50 |
| | X | 1 | 0 | 0 | 1 | X | X | BLOCK 51 |
| | X | 1 | 0 | 1 | 0 | X | X | BLOCK 52 |
| | X | 1 | 0 | 1 | 1 | X | X | BLOCK 53 |
| | X | 1 | 1 | 0 | 0 | X | X | BLOCK 54 |
| | X | 1 | 1 | 0 | 1 | X | X | BLOCK 55 |
| | X | 1 | 1 | 1 | 0 | X | X | BLOCK 56 |
| | X | 1 | 1 | 1 | 1 | X | X | BLOCK 57 |
| | X | 0 | X | X | X | X | X | WHOLE ARRAY 68 |

BLOCK ERASABLE FLASH EEPROM APPARATUS AND METHOD THEREOF

FIELD OF THE INVENTION

The present invention relates in general to EEPROM (Electrically Erasable Programmable Read Only Memory), and more particularly to block erasable flash EEPROM.

BACKGROUND OF THE INVENTION

Non-volatile memories are commonly used in data processing systems. EEPROM (Electrically Erasable Programmable Read Only Memory) is one type of non-volatile memory which is commonly used.

Standard EEPROMs typically provide the capability to erase one byte, one word, or the entire memory array in a single erase procedure. Unfortunately, standard EEPROMs are generally quite expensive in terms of the semiconductor area and the processing steps which are required to manufacture them.

In order to reduce costs, some data processing systems use a type of EEPROM called a "flash" EEPROM. Erasing the entire memory array in a single erase procedure is commonly referred to as a "bulk erase". Present day flash EEPROMs normally allow for only bulk erase; they do not allow for byte or word erase. By eliminating byte and word erase, flash EEPROMs can be built more cheaply than standard EEPROMs. The drawback, however, is that the user of a flash EEPROM cannot update just a few bytes of data stored in a flash EEPROM; the user generally must perform a bulk erase and erase all of the flash EEPROM.

Thus one of the present day trade-offs made when choosing EEPROMs is the trade-off between cost and flexibility. Some users of EEPROMs want the flexibility to be able to erase only a few selected bytes in the EEPROM array. Other users of EEPROMs want the reduced cost of a flash EEPROM that is limited to bulk erase. A manufacturer of EEPROMs can satisfy both categories of users by manufacturing both standard EEPROMs and flash EEPROMs.

However, when an EEPROM is incorporated as part of a single chip microcontroller, the cost to the manufacturer of providing and supporting two different types of EEPROM on the same microcomputer becomes more onerous. For example, the MC68HC16 family of microcontrollers (e.g. MC68HC16X1, MC68HC16Y1, and MC68HC16Z1, all available from Motorola, Inc. of Austin, Tex.) will include a wide variety of individual microcontrollers which share the same central processing unit, but which have different on-chip peripherals, such as memories, timers, analog to digital converters, etc.

It would be quite expensive for a manufacturer of a microcontroller family to support two different types of EEPROM. For example, if eight microcontrollers within the family require some type of EEPROM, the manufacturer would have to design and support sixteen different microcontrollers in order to support both standard EEPROM and flash EEPROM. A less expensive solution for the manufacturer is desired. An inexpensive and flexible flash EEPROM with both bulk erase and block erase is desired "Block erase" involves partitioning one array of EEPROM into a plurality of blocks, each of which can be erased independently of the other blocks.

Although there are prior art flash EEPROMs which provide block erase, the extra semiconductor area required for the addition of the block erase feature increases the cost of the prior art flash EEPROM. For example, a prior art block erasable flash EEPROM (part number TC58F1001P/F, available from Toshiba corporation of Japan) uses an erase procedure which requires extra decode circuitry in order to decode data signals.

In order to erase one block in the Toshiba block erasable flash EEPROM, a write of a data value $60 to any flash EEPROM address must be performed; followed by a write of a data value $60 to a block address. In order to perform a bulk erase in the Toshiba block erasable flash EEPROM, a write of a data value $20 to any flash EEPROM address must be performed; followed by a write of a data value $20 to any flash EEPROM address. Thus in order to permit block erase, decode circuitry had to be added to decode the data signals being written to the flash EEPROM.

In addition, the Toshiba block erasable flash EEPROM is partitioned into thirty-two fixed blocks which are all the same size. If a customer requires a block erasable flash EEPROM which has the same array size, but is partitioned into fewer, but larger blocks, the Toshiba block erasable flash EEPROM will not meet the customer's requirements. Likewise, if a customer requires a block erasable flash EEPROM which has the same array size, but is partitioned into more, but smaller blocks, the Toshiba block erasable flash EEPROM will not meet the customer's requirements.

Some prior art flash EEPROMs may claim to provide block erase, but what they actually provide are separate arrays located on the same integrated circuit. The drawback to this approach is the extra silicon required to build multiple arrays on the same integrated circuit. Building multiple arrays requires a significant amount of circuitry to be duplicated for each array.

A block erasable flash EEPROM which requires minimum semiconductor area and which provides maximum flexibility to the customer is desired.

SUMMARY OF THE INVENTION

The previously mentioned needs are fulfilled and other advantages achieved with the present invention. In one form, the present invention comprises an apparatus and a method for operating a block erasable flash EEPROM memory. The block erasable flash EEPROM memory has a plurality of bit lines and an array of flash EEPROM memory cells. The array of flash EEPROM memory cells has a first block of flash EEPROM memory cells and a second block of flash EEPROM memory cells. The first block of flash EEPROM memory cells is coupled to the second block of flash EEPROM memory cells by way of the plurality of bit lines.

The first block of flash EEPROM memory cells has at least a portion of a first row. The first block of flash EEPROM memory cells has a first source conductor coupled to the at least the portion of the first row. The first block of flash EEPROM memory cells has a first block conductor which is coupled to the first source conductor.

The second block of flash EEPROM memory cells has at least a portion of a second row. The second block of flash EEPROM memory cells has a second source conductor coupled to the at least the portion of the second row. The second block of flash EEPROM memory cells has a second block conductor which is coupled to the second source conductor.

The first block of flash EEPROM memory cells can be erased independently of the second block of flash EEPROM memory cells.

The present invention will be understood by one skilled in the art from the detailed description below in conjunction with the accompanying drawings.

DESCRIPTION OF THE PREFERRED EMBODIMENT

Figure 1:
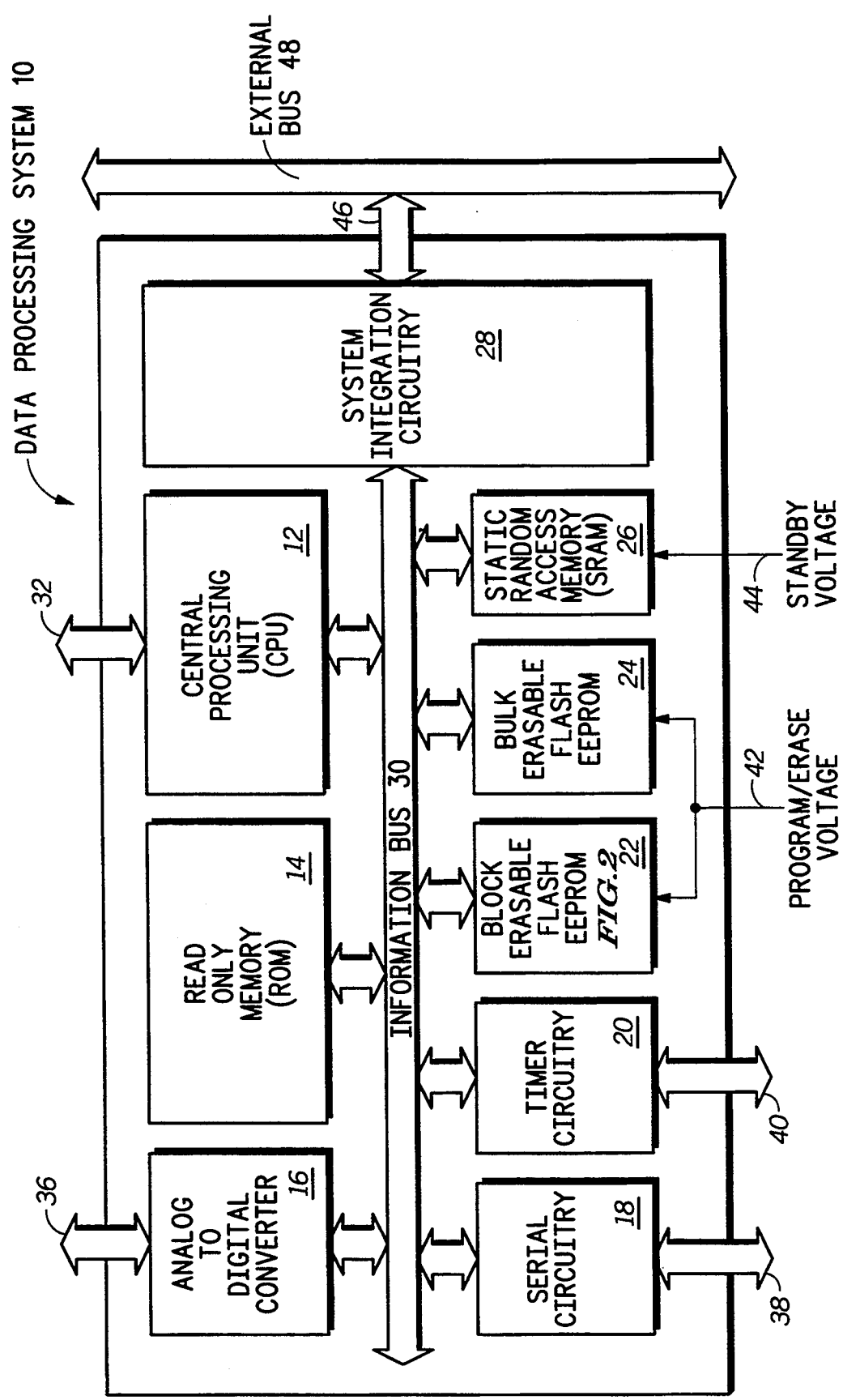
FIG. 1 illustrates, in block diagram form, a data processing system 10 in accordance with one embodiment of the present invention.

One of the present day trade-offs made when choosing a EEPROMs is the trade-off between cost and flexibility. Some users of EEPROMs want the flexibility to be able to erase only a few selected bytes in the EEPROM array. Other users of EEPROMs want the reduced cost of a flash EEPROM that is limited to bulk erase. When an EEPROM is incorporated as part of a single chip microcontroller, the cost to the manufacturer of providing and supporting two different types of EEPROM becomes more costly. A less expensive solution which meets the requirements of all customers is desired by microcontroller manufacturers.

The present invention is a compromise between the more flexible but more costly standard EEPROM, and the less flexible but less costly flash EEPROM. The present invention starts with a prior art flash EEPROM which uses a flash EEPROM cell and is bulk erase only. Then by making selected modifications which do not significantly increase the semiconductor area, and which may not increase the array area, the prior art flash EEPROM is transformed into a block erasable flash EEPROM 22 which has virtually the same cost to the manufacturer as the prior art bulk erasable flash EEPROM, but which now has block erase capability as well. In addition, the number of blocks and the size of each block can be determined by the manufacturer during the manufacturing process. Thus without significantly increasing the semiconductor area required, block erasable flash EEPROM 22 can be easily and cheaply customized to the particular requirements of various customers.

The present invention does not require extra decoding circuitry in order to perform the block select during the erase procedure. Instead, the present invention utilizes the circuitry which is used for column decode during programming and read accesses to perform the block decode during erasure. In the present invention, the single large charge pump which was used to bulk erase the entire array in the prior art flash EEPROM is replaced with a plurality of much smaller charge pumps, each of which is capable of erasing a single block within the entire array.

The single large charge pump in the prior art flash EEPROM had a fixed area capacitor. In the present invention, each of the smaller charge pumps has a variable size capacitor. Each of the variable sized capacitors can be sized according to the size of its corresponding EEPROM block. Like the number and size of the blocks, the size of each variable capacitor can be determined by the manufacturer during the manufacturing process. Thus without significantly increasing the semiconductor area required, block erasable flash EEPROM 22 can be easily and cheaply customized to the particular requirements of various customers.

The present invention may also be useful for microcode development. For example, a new processing unit, such as a central processing unit, a timer processing unit, a serial processing unit, etc. may be built using block erasable flash EEPROM as the storage circuitry for the microcode.

The terms "assert" and "negate" will be used when referring to the rendering of a signal, status bit, or similar apparatus into its logically true or logically false state, respectively. If the logically true state is a digital logic level one, the logically false state will be a digital logic level zero. And if the logically true state is a digital logic level zero, the logically false state will be a digital logic level one.

The term "bus" will be used to refer to a plurality of signals which may be used to transfer one or more various types of information, such as data, addresses, control, or status. The symbol "$" preceding a number indicates that the number is represented in its hexadecimal or base sixteen form. The symbol "%" preceding a number indicates that the number is represented in its binary or base two form.

Referring now to the figures, FIG. 1 illustrates a data processing system 10 which can be implemented as a single integrated circuit called a microcontroller. Data processing system 10 has various on-board peripherals which are bi-directionally coupled by way of an information bus 30. The particular embodiment of data processing system 10 illustrated in FIG. 1 has a central processing unit (CPU) 12, a read only memory (ROM) 14, an analog to digital converter 16, serial circuitry 18, timer circuitry 20, block erasable flash EEPROM 22, bulk erasable flash EEPROM 24, static random access memory (SRAM) 26, and system integration circuitry 28, which are all bi-directionally coupled to an information bus 30.

System integration circuitry 28 can receive and transmit signals external to data processing system 10 by way of integrated circuit pins 46. Integrated circuit pins 46 may optionally be coupled to an external bus 48. CPU 12 may optionally receive and transmit signals external to data processing system 10 by way of integrated circuit pins 32. Analog to digital converter 16 can receive and transmit signals external to data processing system 10 by way of integrated circuit pins 36. Serial circuitry 18 can receive and transmit signals external to data processing system 10 by way of integrated circuit pins 38. Timer circuitry 20 can receive and transmit signals external to data processing system 10 by way of integrated circuit pins 40. Block erasable flash EEPROM 22 and bulk erasable flash EEPROM 24 can receive a program/erase voltage signal by way of integrated circuit pin 42. SRAM 26 can receive a standby voltage signal by way of integrated circuit pin 44.

The embodiment of data processing system 10 which is shown in FIG. 1 illustrates one particular microcontroller within a family of microcontrollers. Because microcontrollers in the same family generally have a plurality of differing on-board peripherals, FIG. 1 provides only one embodiment of data processing system 10. For example, other embodiments of data processing system 10 may not have ROM 14, analog to digital converter 16, or serial circuitry 18. In fact, alternate embodiments of data processing system 10 may have fewer, more, or different on-board peripherals than those illustrated in FIG. 1.

Figure 2:
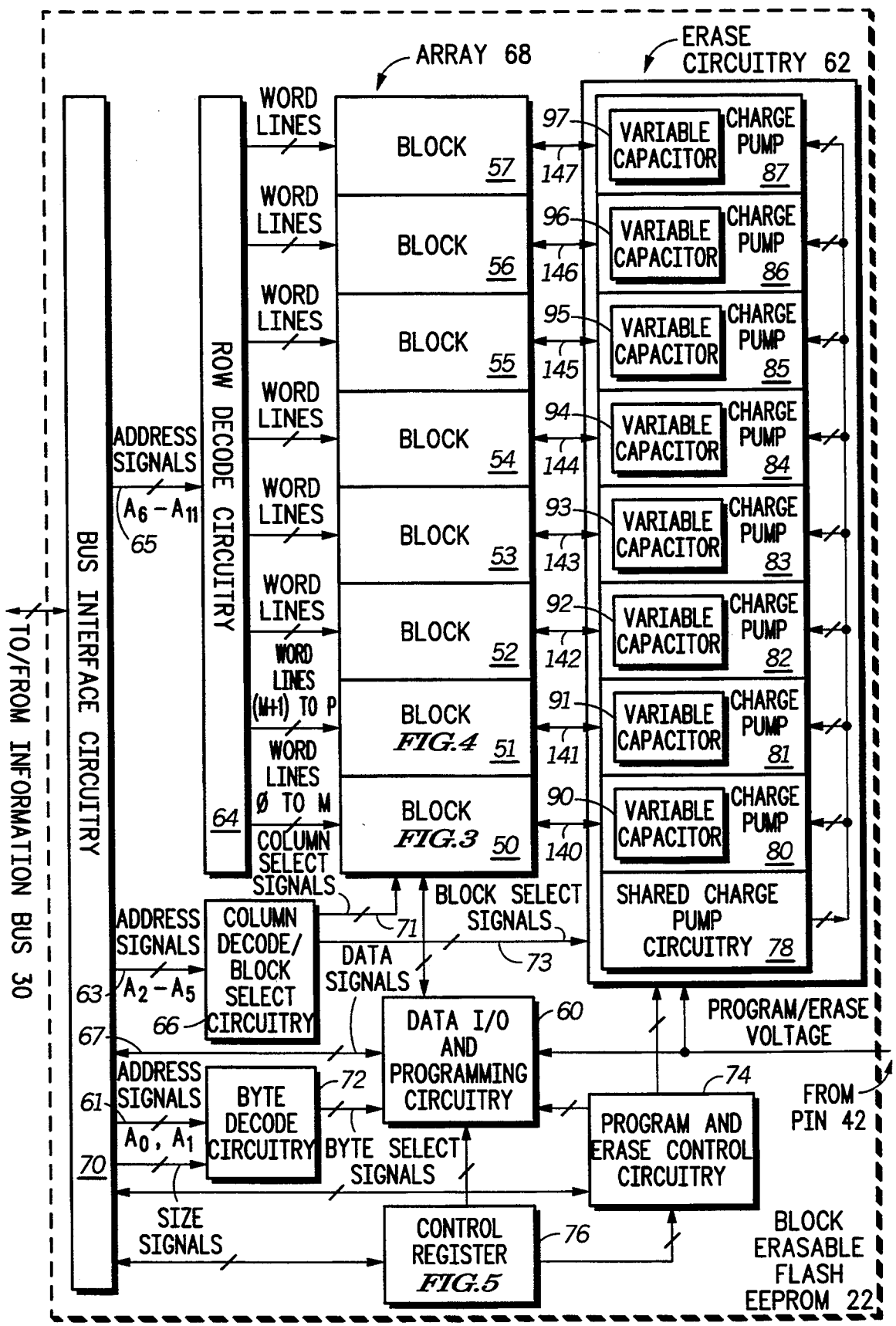
FIG. 2 illustrates, in block diagram form, a block erasable flash EEPROM 22 of FIG. 1 in accordance with one embodiment of the present invention.

FIG. 2 illustrates one embodiment of a block erasable flash EEPROM 22. A single array of flash EEPROM memory cells 68 is divided into a plurality of blocks 50–57. Although the illustrated embodiment is divided into eight blocks, alternate embodiments of the present invention may use any number of blocks. Each block receives a plurality of word lines from row decode circuitry 64. Block 50 receives word lines 0 to M, and block 51 receives word lines (M+1) to P. Row decode circuitry 64 receives address signals from bus interface circuitry 70. Although row decode circuitry 64 in the illustrated embodiment receives address signals A6–A11, row decode circuitry 64 in alternate embodiments of the present invention may receive fewer, more, or different address signals.

Bus interface circuitry 70 is coupled to information bus 30 in order to allow block erasable flash EEPROM 22 to communicate with other portions of circuitry in data processing system 10. For example, bus interface circuit 70 may receive address and data signals from CPU 12 across information bus 30, and bus interface circuit 70 may transfer data signals back to CPU 12 across information bus 30.

Bus interface circuit 70 transfers address signals to column decode/block select circuitry 66. Although column decode/block select circuitry 66 in the illustrated embodiment receives address signals A2–A5, column decode/block select circuitry 66 in alternate embodiments of the present invention may receive fewer, more, or different address signals.

Bus interface circuit 70 transfers address signals and size signals to byte decode circuitry 72. Although byte decode circuitry 72 in the illustrated embodiment receives address signals A0–A1, byte decode circuitry 72 in alternate embodiments of the present invention may receive fewer, more, or different address signals.

Bus interface circuit 70 is bi-directionally coupled to data I/O and programming circuitry 60. Data I/O and programming circuitry 60 receives data signals from bus interface circuit 70 and transfers data signals to array 68. In addition, data I/O and programming circuitry 60 receives data signals from array 68 and transfers data signals to bus interface circuit 70.

Data I/O and programming circuitry 60 also receives byte selects signals from byte decode circuitry 72. The byte select signals are used by the data I/O and programming circuitry 60 to determine the alignment and the number of bytes being accessed in array 68. Data I/O and programming circuitry 60 includes circuitry which is used to program the flash EEPROM cells in array 68.

Column decode/block select circuitry 66 provides column select signals to array 68 and provides block select signals to erase circuitry 62. The present invention uses the same decode circuitry and decodes the same address signals in order to provide both column select signals and block select signals. The column decode signals are used during read accesses and programming. The block select signals are used during erasing.

Bus interface circuit 70 is bi-directionally coupled to program and erase control circuitry 74. Bus interface circuit 70 is bi-directionally coupled to control register 76 so that control register 76 can be read and written. Control register 76 is coupled to program and erase control circuitry 74 and to data I/O and programming circuitry 60 in order to provide control bit values. Program and erase control circuitry 74 is coupled to data I/O and programming circuitry 60 and erase circuitry 62 in order to provide control information. Pin 42, which supplies a program/erase voltage, is coupled to erase circuitry 62 and is coupled to data I/O and programming circuitry 60.

Erase circuitry 62 includes a plurality of charge pumps 80–87. Each charge pump 80–87 is coupled to shared charge pump circuitry 78. Each charge pump 80–87 includes a variable capacitor 90–97. For example, charge pump 80 includes variable capacitor 90, and charge pump 81 includes variable capacitor 91.

Charge pump 80 is bi-directionally coupled to block 50 by way of block conductor 140. Charge pump 81 is bi-directionally coupled to block 51 by way of block conductor 141. Charge pump 82 is bi-directionally coupled to block 52 by way of block conductor 142. Charge pump 83 is bi-directionally coupled to block 53 by way of block conductor 143. Charge pump 84 is bi-directionally coupled to block 54 by way of block conductor 144. Charge pump 85 is bi-directionally coupled to block 55 by way of block conductor 145. Charge pump 86 is bi-directionally coupled to block 56 by way of block conductor 146. Charge pump 87 is bi-directionally coupled to block 57 by way of block conductor 147.

One possible embodiment of the flash EEPROM memory cells in array 68 is provided in commonly assigned U.S. Pat. No. 5,130,769, filed May 16, 1991, entitled NONVOLATILE MEMORY CELL, invented by Kuo, et al., which is expressly incorporated by this reference. Alternate embodiments of the flash EEPROM memory cells could be used. The circuitry required to implement the blocks illustrated in FIG. 2 is known to one of average skill in the art.

Figure 3:
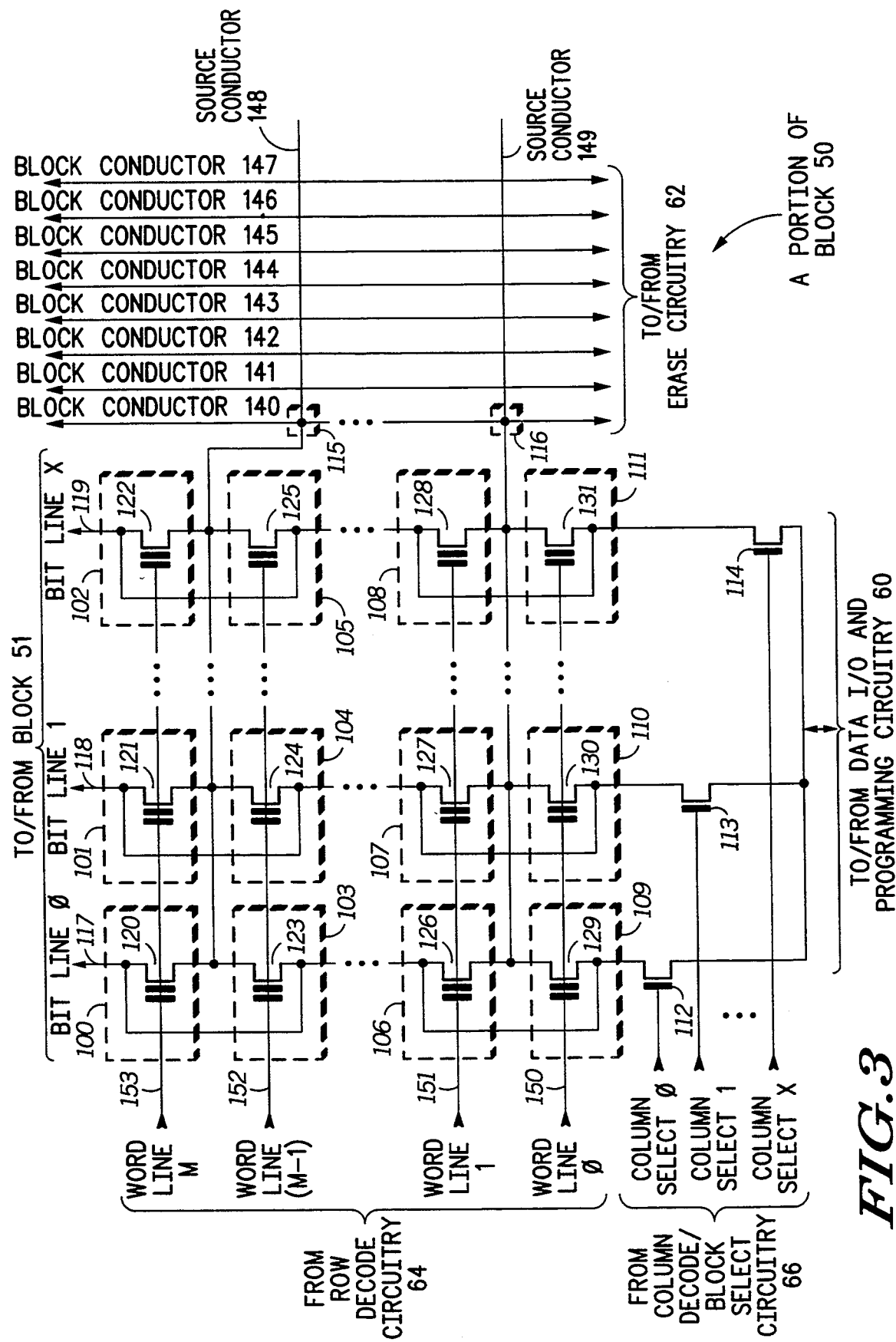
FIG. 3 illustrates, in block diagram form, a portion of a block 50 of FIG. 2 in accordance with one embodiment of the present invention.

FIG. 3 illustrates one embodiment of a portion of block 50 in array 68. Block 50 has (M+1) rows and (X+1) columns, and includes flash EEPROM memory cells 100–111. Each word line, namely word line 0 through word line M, is coupled to each flash EEPROM memory cell in its respective row. Each bit line, namely bit line 0 through bit line X, is coupled to each flash EEPROM memory cell in its respective column. The rows between row 1 and row (M−1) are not illustrated, but are indicated by dotted lines. The columns between column 1 and column X are not illustrated, but are indicated by dotted lines. Each reference numeral 117–119 indicates a bit line which is common to all of the blocks 50–57; and each reference numeral 150–153 indicates a word line which is unique to block 50. Note that FIG. 3 illustrates only one of the data bits received from or transferred to data I/O and programming circuitry 60.

Each column select signal, namely column select 0 through column select X, used to select one column and couple it to data I/O and programming circuitry 60. For example, column select signal 0 is provided to the gate of n-channel CMOS transistor 112, the source of transistor 112 is coupled to bit line 0, and the drain of transistor 112 is coupled to data I/O and programming circuitry 60. Column select signal 1 is provided to the gate of n-channel CMOS transistor 113, the source of transistor 113 is coupled to bit line 1, and the drain of transistor 113 is coupled to data I/O and programming circuitry 60. Column select signal X is provided to the gate of n-channel CMOS transistor 114, the source of transistor 114 is coupled to bit line X, and the drain of transistor 114 is coupled to data I/O and programming circuitry 60.

In the illustrated embodiment, each flash EEPROM memory cell 100-111 includes one floating-gate transistor 120-131, each of which has a source electrode, a drain electrode, and a gate electrode. The drain electrode of each transistor in a column is coupled to the bit line for that column. The gate electrode of each transistor in a row is coupled to the word line for that row. The source electrode of each transistor in a row is coupled to the source electrode of every other transistor in that row, and is also coupled to a source conductor. For example, the source electrode of each transistor in row M is coupled to source conductor 148, and the source electrode of each transistor in row 1 is coupled to source conductor 149.

In the illustrated embodiment of the present invention, the source electrode of each transistor in a row is also coupled to the source electrode of a corresponding transistor in an adjacent row. For example, the source electrode of transistor 120 in row M is coupled to the source electrode of transistor 123 in row (M−1), and the source electrode of transistor 121 in row M is coupled to the source electrode of transistor 124 in row (M−1).

Because the source electrode of each transistor in a row is coupled to the source electrode of a corresponding transistor in an adjacent row, the illustrated embodiment requires that a minimum of two rows be erased at a time. Alternate embodiments of the present invention may use one source conductor for every row. In yet other embodiments, any number of rows may be coupled to each source conductor. However, the number of rows coupled to each source conductor affects the minimum block size by determining the minimum number of rows which can be erased at the same time.

Figure 4:
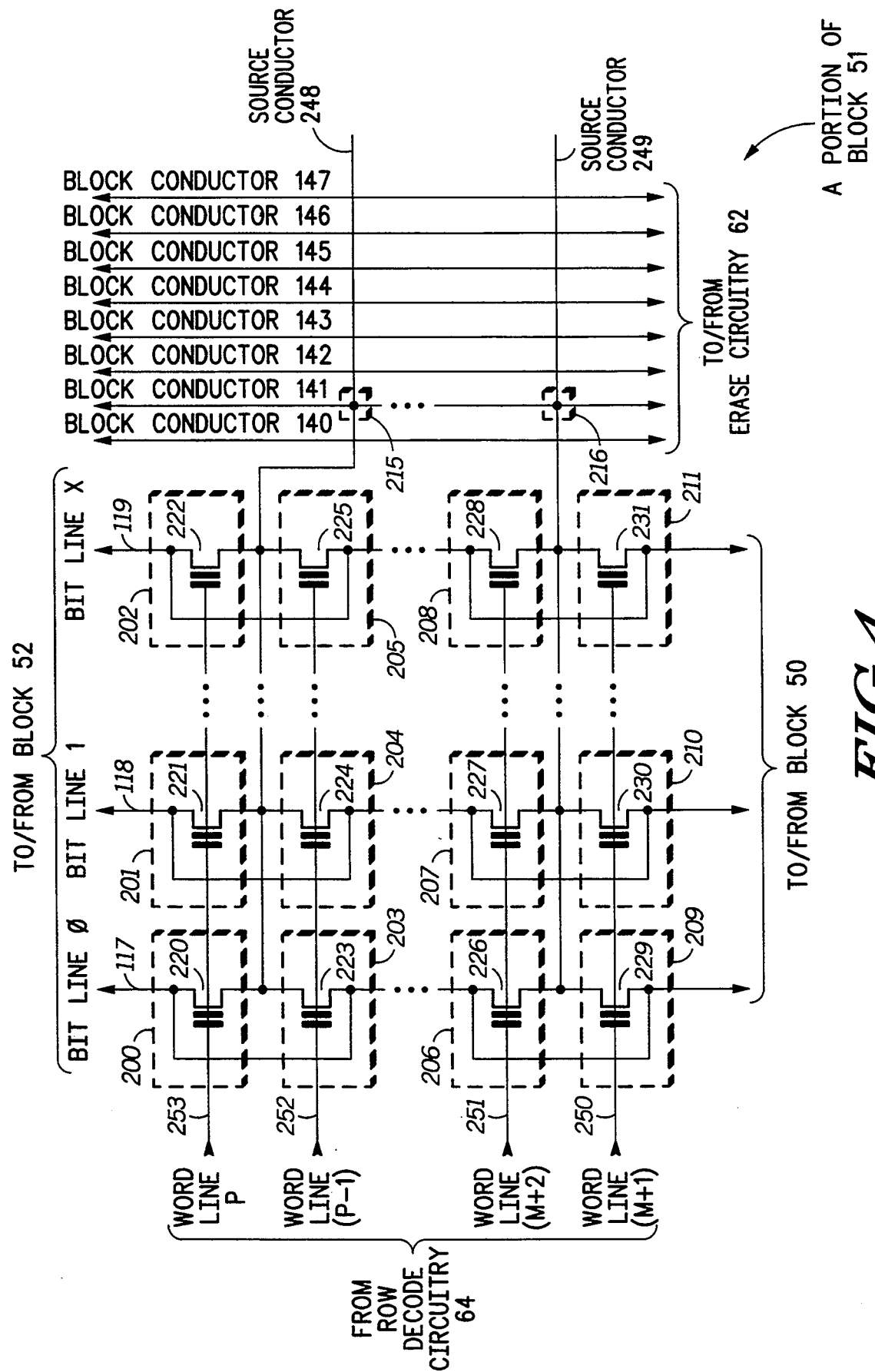
FIG. 4 illustrates, in block diagram form, a portion of a block 51 of FIG. 2 in accordance with one embodiment of the present invention.

Block conductors 140-147 are routed through each block 50-57 in array 68 (see FIGS. 2-4). However, each block 50-57 may be coupled to only one block conductor. Block conductors 140-147 are used to delineate the boundaries of each block 50-57 in array 68 (see FIG. 2). All of the source conductors within a block are coupled to the same block conductor. For example, referring to FIG. 3, all of the source conductors for rows 0 to M are coupled to the same block conductor, namely block conductor 140. Referring to FIG. 4, all of the source conductors for rows (M+1) to P are coupled to the same block conductor, namely block conductor 141.

A block conductor is used to provide, to each of the source conductors which are coupled to that particular block conductor, the appropriate voltage level(s) for erasing, programming, and reading. Each source conductor is coupled to only one block conductor, and the coupling in the illustrated embodiment of the present invention is by way of a via (e.g. via 115 and via 116 in FIG. 3). Note that the present invention can be used with any erasing, programming, or reading voltage level or combination of voltage levels on block conductors 140-147 which are compatible with the cell structure used to implement flash EEPROM memory cells 100-111 and 200-211. As was discussed herein above, various structures could be used to implement flash EEPROM memory cells 100-111 and 200-211.

In the illustrated embodiment of the present invention, pin 42 is only used to supply the voltage level(s) required for erasing, programming, and reading; pin 42 has no effect on the selection of one or more blocks for erasing. Note that in some embodiments of the present invention, all word lines are deselected and thus remain at the same deselected voltage level during erasing. Also, in some embodiments of the present invention, all bit lines are deselected during erasing.

Referring to FIG. 3, source conductor 148 is coupled to block conductor 140 by way of via 115 and source conductor 149 is coupled to block conductor 140 by way of via 116. A "via" is a conductive link made between two or more nodes during the process of manufacturing an integrated circuit.

FIG. 4 illustrates one embodiment of a portion of block 51 in array 68. Block 51 has (P−M) rows and (X+1) columns, and includes flash EEPROM memory cells 200-211. Each word line, namely word line (M+1) through word line P, is coupled to each flash EEPROM memory cell in its respective row. Each bit line, namely bit line 0 through bit line X, is coupled to each flash EEPROM memory cell in its respective column. The rows between row (M+2) and row (P−1) are not illustrated, but are indicated by dotted lines. The columns between column 1 and column X are not illustrated, but are indicated by dotted lines. Each reference numeral 117-119 indicates a bit line which is common to all of the blocks 50-57; and each reference numeral 250-253 indicates a word line which is unique to block 51.

In the illustrated embodiment, each flash EEPROM memory cell 200-211 includes one floating-gate transistor 220-231, each of which has a source electrode, a drain electrode, and a gate electrode. The drain electrode of each transistor in a column is coupled to the bit line for that column. The gate electrode of each transistor in a row is coupled to the word line for that row. The source electrode of each transistor in that row is coupled to the source electrode of every other transistor in that row, and is also coupled to a source conductor. For example, the source electrode of each transistor in row P is coupled to source conductor 248, and the source electrode of each transistor in row (M+2) is coupled to source conductor 249.

In the illustrated embodiment of the present invention, the source electrode of each transistor in a row is also coupled to the source electrode of a corresponding transistor in an adjacent row. For example, the source electrode of transistor 220 in row P is coupled to the source electrode of transistor 223 in row (P−1), and the source electrode of transistor 221 in row P is coupled to the source electrode of transistor 224 in row (P−1).

Block conductors 140-147 are routed through each block 50-57 in array 68 (see FIGS. 2-4). However, each block 50-57 may be coupled to only one block conductor. Block conductors 140–147 are used to delineate the boundaries of each block 50–57 in array 68. All of the source conductors within a block are coupled to the same block conductor. For example, referring to FIG. 4, all of the source conductors for rows (M+1) to P are coupled to the same block conductor, namely block conductor 141.

Still referring to FIG. 4, source conductor 248 is coupled to block conductor 141 by way of via 215 and source conductor 249 is coupled to block conductor 141 by way of via 216.

Note that the circuitry used to implement blocks 52–57 in FIG. 2 may be identical to the circuitry used to implement block 51 illustrated in FIG. 4. The circuitry used to implement block 50 (see FIG. 3) may also be identical to the circuitry used to implement block 51 illustrated in FIG. 4, if transistors 112–114 in FIG. 3 are implemented as part of data I/O and programming circuitry 60. Thus blocks 50–57 in the present invention may be implemented as one contiguous array 68 with no intervening logic between each of the blocks. Thus each block may be directly connected to the adjacent block or blocks by way if the bit lines (e.g. bit lines 117–119).

Figures 5, 7:
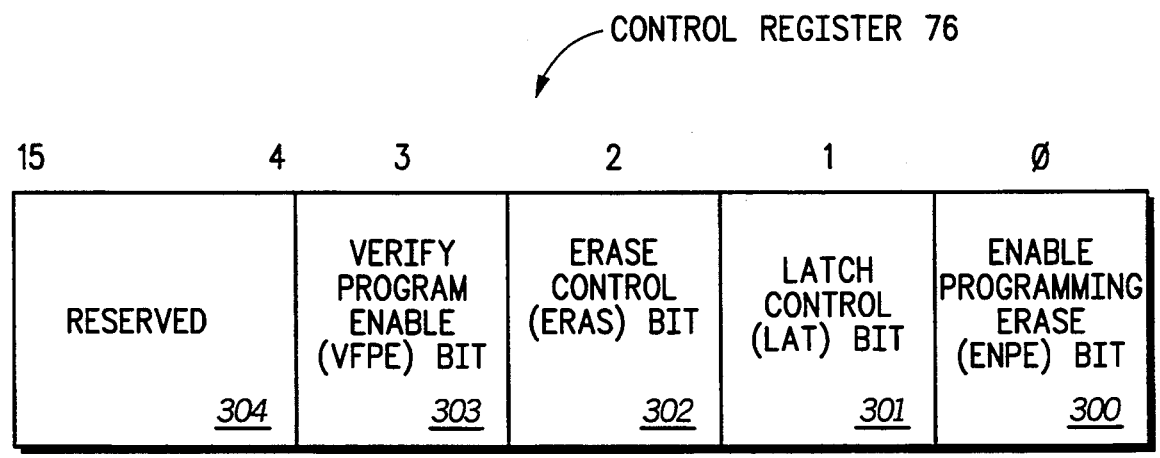
FIG. 5 illustrates, in block diagram form, a control register 76 of FIG. 2 in accordance with one embodiment of the present invention.
FIG. 7 illustrates, in tabular form, which address values can be used to erase which block(s) 50-57 in accordance with one embodiment of the present invention.

FIG. 5 illustrates one embodiment of the control register 76 of FIG. 2. In the illustrated embodiment, control register 76 is a 16-bit register having four control bits 300–303 which control the programming and erasing of block erasable flash EEPROM 22. Control register 76 also has twelve control bits 304 which are not currently implemented, but which are reserved for future use. Alternate embodiments of the present invention may use fewer, more, or different control bits. The reset state of control register 76 is $00.

Referring to bit 3, the Verify Program Enable (VFPE) control bit 303 is used to determined the type of read cycle which is performed. If the VFPE control bit 303 is asserted (VFPE=1), then verify read cycles can be performed, if additional conditions are met, when read accesses are made to block erasable flash EEPROM 22. If the VFPE control bit 303 is negated (VFPE=0), then normal read cycles will be performed when read accesses are made to block erasable flash EEPROM 22. VFPE control bit 303 can always be read by way of information bus 30. However, VFPE control bit 303 can only be written by way of information bus 30 if the ENPE control bit 300 is negated (ENPE=0).

The VFPE control bit 303 invokes a special program verify circuit (not shown). During programming procedures (ERAS=0), the VFPE control bit 303 is used in conjunction with the Latch Control (LAT) control bit 301 to determine when programming of an array 68 location is complete. If VFPE control bit 303 and LAT control bit 301 are both asserted (VFPE=1, LAT=1), and the programming write has been completed, a bit wise exclusive-OR logical operation is performed. When any valid location in array 68 is read, each bit of the latched data is exclusive-ORed with the corresponding bit of the data currently in the location being programmed. If the location is completely programmed, a digital logic level zero will be read. Any other value obtained from the read, other than a digital logic level zero, indicates that the location is not fully programmed. When the VFPE control bit 303 is negated VFPE=0), read accesses of valid array 68 locations will occur normally.

Referring to bit 2, the Erase Control (ERAS) control bit 302 is used to determined whether the block erasable flash EEPROM 22 is configured for erasing or for programming. If the ERAS control bit 302 is asserted (ERAS=1), then block erasable flash EEPROM 22 is configured for erasing. If the ERAS control bit 302 is negated (ERAS=0), then block erasable flash EEPROM 22 is configured for programming. ERAS control bit 302 can always be read by way of information bus 30. However, ERAS control bit 302 can only be written by way of information bus 30 if the ENPE control bit 300 is negated (ENPE=0). The value of the ERAS control bit 302 cannot be changed if the program/erase voltage is at its programming/erasing voltage and is being applied to array 68 (ENPE=1).

Referring to bit 1, the Latch Control (LAT) control bit 301 may affect the type of read cycle which is performed. If the LAT control bit 301 is asserted (LAT=1), then programming latches (not shown) internal to block erasable flash EEPROM 22 are enabled during the next write access to array 68. Subsequent read accesses will result in a read of the location pointed to by the value stored in the programming latches (not shown). If the LAT control bit 301 is negated (LAT=0), then programming latches (not shown) internal to block erasable flash EEPROM 22 are disabled and subsequent read accesses to array 68 are not affected. LAT control bit 301 can always be read by way of information bus 30. However, LAT control bit 301 can only be written by way of information bus 30 if the ENPE control bit 300 is negated (ENPE=0).

The block erasable flash EEPROM 22 has an internal address bus (illustrated by conductors 61, 63, and 65 in FIG. 2) and has an internal data bus (illustrated by conductor 67 in FIG. 2). When the LAT control bit 301 is negated (LAT=0), the internal address bus (61, 63, 65) and the internal data bus 67 are coupled to the corresponding address and data signals of information bus 30. Thus, the block erasable flash EEPROM 22 is configured for normal read accesses.

However, when LAT control bit 301 is asserted (LAT=1), the internal address bus (61, 63, 65) and the internal data bus 67 are coupled to parallel internal latches (not shown). Thus, the LAT control bit 301 is used to properly configure the block erasable flash EEPROM 22 in order to perform programming or erasing. If LAT control bit 301 is asserted (LAT=1), on the next write to a valid array 68 location, the parallel internal latches (not shown) will latch the incoming address value and data value. The incoming address value indicates the array 68 location which will be programmed with the incoming data value. Assuming the ERAS control bit 302 is negated (ERAS=0), the incoming data value is latched when the programming procedure is started, i.e. when ENPE is asserted (ENPE=1).On read cycles after the address and data have been latched, the combination of LAT control bit 301, ERAS control bit 302, and VFPE control bit 303 will affect the result of the read operation.

Referring to bit 0, the Enabled Programming/Erase (ENPE) control bit 300 is used to determine whether or not the program/erase voltage is at its programming/erasing voltage and is being applied to array 68. If the ENPE control bit 300 is asserted (ENPE=1), then the program/erase voltage is applied to block erasable flash EEPROM 22. If the ENPE control bit 300 is negated (ENPE=0), then the program/erase voltage is not applied to block erasable flash EEPROM 22. ENPE control bit 300 can always be read and written by way of information bus 30.

The ENPE control bit 300 is used to control the application of the program/erase voltage to the block erasable flash EEPROM 22 for program or erase operations. Note that the program/erase voltage is supplied to block erasable flash EEPROM 22, by way of pin 42, from external to data processing system 10. The ENPE control bit 300 can be asserted only after the LAT control bit 301 has been asserted and after a write to the data and address latches (not shown) has occurred. If an attempt is made to assert the ENPE control bit 300 when the LAT control bit is negated, or if the internal latches (not shown) have not been written to after the LAT control bit 301 was asserted, the ENPE control bit 300 will remain negated after the write cycle is complete.

The LAT control bit 301, the ERAS control bit 302, and the VFPE control bit 303 cannot be changed when the ENPE control bit is asserted (ENPE=1). A write to control register 76 when the ENPE control bit 76 is asserted may only affect the state of the ENPE control bit 300; the LAT control bit 301, the ERAS control bit 302, and the VFPE control bit 303 will remain unchanged. Attempts to read an array 68 location while ENPE is asserted (ENPE=1) will be ignored.

Figure 6:
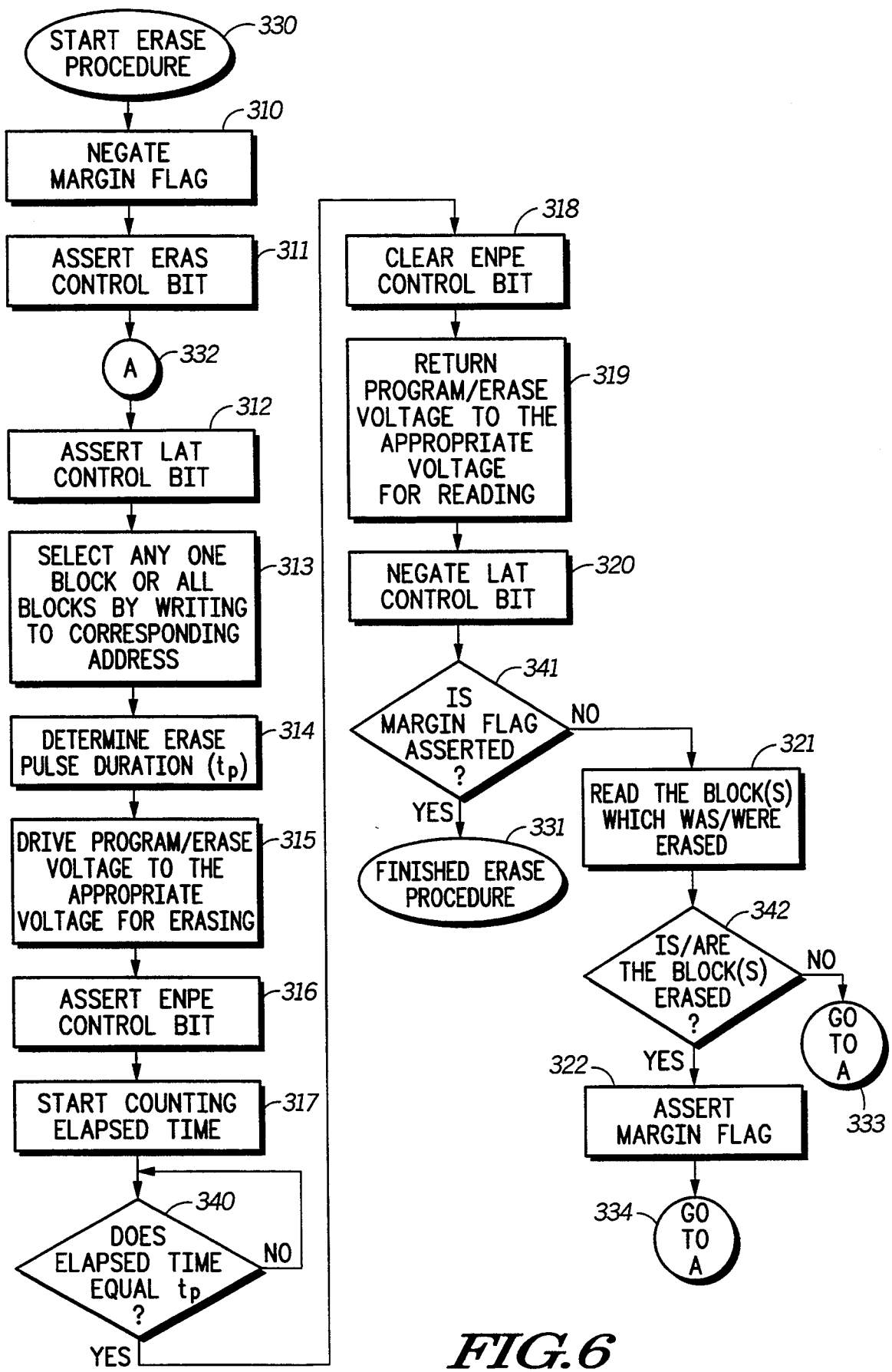
FIG. 6 illustrates, in flow diagram form, an erase procedure in accordance with one embodiment of the present invention.

FIG. 6 illustrates, in flow diagram form, one embodiment of an erase procedure for block erasable flash EEPROM 22. Rectangles 310–322 represents steps which are performed during the erase procedure. Oval 330 represent the starting point of the erase procedure, and oval 331 represents the finishing point of the erase procedure. Circle 332 represents a re-entry point in the erase procedure, and circles 333–334 represents a transition to a re-entry point. Diamonds 340–342 represents decisional points in the erase procedure. Alternate embodiments of the present invention may use a different erase procedure.

When programming or erasing one embodiment of block erasable flash EEPROM 22, an optional special verification sequence is used in order to ensure that the program/erase procedure is reliable, and also to provide the longest possible life expectancy. The special verification sequence requires the user to stop the program/erase procedure periodically in order to determine if the block erasable flash EEPROM 22 has been completely programmed/erased.

Also during the special verification sequence, after the selected locations in array 68 reach the proper value, the programming/erasing of these same locations for a short period of time to ensure that the locations will remain programmed/erased. Failure to extend the program/erase time of locations just programmed/erased could result in an erroneous verification.

Referring to FIG. 6, symbols 310, 341, 321, 342, 333, 332, and 334 represents steps performed during the special verification sequence, and are thus not required in some embodiments of the present invention. The margin flag is a software or hardware flag which is used to indicate whether an extra margin of programming/erasing time has already been performed. Alternate embodiments of the present invention may not use a special verification procedure and may not use margin flag.

To begin a program or erase procedure, the ERAS control bit 302 (see FIG. 5) is negated or asserted, depending on whether a program procedure or an erase procedure is to be performed. The LAT control bit 301 is asserted in order to cause any subsequent data written to a valid address within array 68 to be latched into the internal address and data latches (not shown). The next write cycle must be either to the location that is to be programmed (if a programming procedures is being performed), or to an address value corresponding to the block(s) 50–57 that is/are to be erased (if an erase procedure is being performed). Refer to FIG. 7 for which address values correspond to the erasure of which blocks 50–57.

The desired duration of the erase pulse $t_p$ must be determined. The program/erase voltage must be driven to the appropriate voltage for erasing. In the illustrated embodiment (see FIG. 1), pin 42 must be driven by an external power source (not shown) to the appropriate voltage for erasing.

Writing the block address and data information to an array 68 location is followed by assertion of the ENPE control bit 300 in order to apply the program/erase voltage to the selected block(s) in array 68. The LAT control bit 301 must be asserted and the incoming address and data values must be latched before the ENPE control bit 300 is asserted. If the incoming data and address have not been latched, an attempt to assert the ENPE control bit 300 will be ignored and the ENPE control bit 300 will remain negated after the write cycle to control register 76 is completed. The LAT control bit 301 must remain asserted and the ERAS control bit 302 must remain in its current state as long as the ENPE control bit 300 is asserted.

The programming software is responsible for all timing during a program/erase procedure. This includes the total length of time that the program/erase voltage is present during program/erase operations, the length of the program/erase pulse, the length of the final margin program/erase pulse, and the delay between turning off the high voltage and verifying the operation. The erase pulse duration $t_p$ may be adjusted during the program or erase cycle to obtain the optimum erase performance for the particular device being erased. The erase pulse duration $t_p$ may be increased each time through an erase loop. Note that the erase pulse duration $t_p$ may be different than the pulse duration used for programming.

It is important to ensure that a program/erase procedure is not currently in progress before either starting another program/erase procedure, or attempting to read from array 68. Even though clearing the ENPE control bit 300 prevents the program/erase voltage from being applied to array 68, the user must take care to ensure that pin 42 is at the appropriate voltage for reading whenever programming/erasing is not in progress.

In one embodiment of the present invention, the programming procedure is the same as the erasing procedure, with the exception of the value of the ERAS control bit 302. Thus the same circuitry, namely program and erase control circuitry 74, can be used to control either an erase procedure or a program procedure. The program and erase control circuitry 74 uses the value of the ERAS control bit 300 to determine whether to enable erase circuitry 62, or to enable data I/O and programming circuitry 60.

FIG. 7 illustrates which address values can be used to erase which block(s) 50–57 in array 68. Referring to FIG. 2, column decode/block select circuitry 66 receives address signals A2–A5 and decodes these signals to provide column select signals to array 68 by way of conductors 71, and to provide block select signals to erase circuitry 62 by way of conductors 73.

It is important to note that the same decode circuitry which is required to generate column select signals for read accesses and for programming can also be used to generate block select signals for erasing. Thus no extra decode circuitry is required in order to generate the block select signals. Note that the column select signals are only used during read accesses and programming when the data I/O and programming circuitry 60 is enabled. Likewise, note that the block select signals are only used during erasing when the erase circuitry 62 is enabled.

Referring to FIG. 7, in the illustrated embodiment of the present invention, addresses A9–A31 are used to indicate the base address of block erasable flash EEPROM 22. For example, if the base address of block erasable flash EEPROM 22 was %xxxx xxxx xxxx 1110 0000 0000, any address that had all ones in address bits A9–A11 would access block erasable flash EEPROM 22. Note that in FIG. 7, address bits A6–A8 and A0–1 are don't care values which could be either a one or a zero.

Only address bits A2–A5 are used to determine which block(s) in array 68 are to be erased. If an address value %xxxx xxxx xxxx 111x xx10 00xx is received by block erasable flash EEPROM 22 during step 313 in FIG. 6, column decode/block select circuitry 66 decodes address bits A2–A5 and asserts the block select signal for block 50. Erase circuitry 62 receives this asserted block select signal for block 50 and enables charge pump 80. Charge pump 80 and shared charge pump circuitry 78, under the control of program and erase control circuitry 74, apply the program/erase voltage to only block 50. Thus only block 50 is erased. The other charge pumps 81–87 are not enabled; and thus blocks 51–57 are not erased.

Note that bulk erase capability is still available. If an address value %xxxx xxxx xxxx 111x xx0x xxxx is received by block erasable flash EEPROM 22 during step 313 in FIG. 6, column decode/block select circuitry 66 decodes address bits A2–A5 and asserts all of the block select signals for blocks 50–57. Erase circuitry 62 receives the asserted block select signals for blocks 50–57 and enables charge pumps 80–87. Charge pumps 80–87 and shared charge pump circuitry 78, under the control of program and erase control circuitry 74, apply the program/erase voltage to all of the block 50–57. Thus all of the block 50–57 are erased.

Although the illustrated embodiment uses addresses A2–A5, alternate embodiments of the present invention could decode more, fewer, or different address signals to generate both the column select signals and the block select signals. The number of blocks and the size of each block can be determined by the manufacturer during a final manufacturing step, such as a final metallization layer. Thus the manufacturer can customize block erasable flash EEPROM 22 to meet the specific needs of many different customers merely by customizing a final manufacturing step.

The number of blocks and the size of each block is determined by vias, such as via 115 and via 116 illustrated in FIG. 3, and via 215 and via 216 illustrated in FIG. 4. The vias are formed during a manufacturing step, such as a metallization or interconnect step. In some embodiments of the present invention, the manufacturing step used to form the vias requires only one masking step. The vias are used to couple each block conductor 140–147 to the desired source conductors (e.g. source conductors 148 and 149 illustrated in FIG. 3, and source conductors 248 and 249 illustrated in FIG. 4).

Note that one or more block conductors 140–147 may not be coupled by way of a via to any source conductor. This is the manner in which the number of blocks is determined. The number of available block conductors 140–147 determines the maximum number of blocks. For example, if block conductors 145–147 are not coupled by way of a via to any source conductor, then all of array 68 can be partitioned into five blocks using block conductors 140–144. Alternate embodiments of the present invention may use any number of block conductors.

Note that which source conductors are coupled to which block conductors 140–147 determines the size of each block. For example, if block conductor 140 in FIG. 3 is only coupled to source conductor 148 by way of via 115, and to source conductor 149 by way of via 116, then block 50 includes only four rows in array 68. However, if block conductor 140 in FIG. 3 is coupled to half of the source conductors in array 68, then block 50 includes half of the rows in array 68.

Referring to FIG. 2, instead of a single large charge pump having a fixed value capacitor which was used to bulk erase the entire array in a prior art flash EEPROM, the present invention uses a plurality of much smaller charge pumps 80–87, each of which is capable of erasing a single block 50–57 within array 68. Each charge pump 80–87 has a variable capacitor 90–97. The capacitance value of a variable capacitor 90–97 significantly affects the amount of time which is required to program or erase a fixed number of EEPROM cells.

In the present invention, each of the variable sized capacitors 90–97 can be sized according to the size of its corresponding EEPROM block during a manufacturing step, such as a metallization or interconnect step. In some embodiments of the present invention, the manufacturing step used to determine the capacitance values of capacitors 90–97 requires only one masking step.

Note that the manufacturing step used to determine the capacitance value may be the same manufacturing step used to form vias 115, 116, 215, and 216. In fact, a single masking step used to determine the capacitance value may be the same single masking step used to form vias 115, 116, 215, and 216. Thus the capacitance value of each capacitor 90–97 and the placement of vias 115, 116, 215, and 216 may be determined by way of the same mask option during manufacture of the block erasable flash EEPROM memory 22. Although a mask option may be implemented using one or more masking steps, it is usually preferable to use the minimum number of masking steps.

As a result of adjusting the capacitance value of each variable capacitor 90–97, the amount of time required to erase each block 50–57 can be the same, regardless of the block size. Thus the software erase procedure, including the erase pulse duration, can be the same for all of the blocks 50–57, even though each block may be a different size. So, as is true of the number and size of the blocks, the size of each variable capacitor can be determined by the manufacturer during a manufacturing step.

In summation, the present invention starts with a prior art flash EEPROM which uses a flash EEPROM cell and is bulk erase only. Then by making selected modifications which do not significantly increase the semiconductor area, the prior art EEPROM is transformed into a block erasable flash EEPROM 22 which has virtually the same cost to the manufacturer as the prior art bulk erasable flash EEPROM, but which now has block erase capability as well. In addition, the number of blocks and the size of each block can be determined by the manufacturer during the manufacturing process. Thus without significantly increasing the semiconductor area required, block erasable flash EEPROM (22) can be easily and cheaply customized to the particular requirements of various customers.

In alternate embodiments of the present invention, a combination of selected address and/or data signals, without decoding, could be used directly as block select signals. Various address and/or data combinations could be used to erase varying number of blocks. For example, a first address and/or data combination could cause erasure of block 50; a second address and/or data combination could cause erasure of blocks 50 and 51; a third address and/or data combination could cause erasure of blocks 50, 51, and 52; etc., until a final address and/or data combination could cause erasure of all of the blocks 50–57.

While the present invention has been illustrated and described with reference to specific embodiments, further modifications and improvements will occur to those skilled in the art. For example, array 68 may be partitioned into any positive, whole number of blocks. Block erasable flash EEPROM 22 may be incorporated as part of a microcontroller or other type of integrated circuit, may be incorporated as part of a programmable logic array, or may be a stand alone memory integrated circuit. Array 68 may have any number of memory cells, and may be arranged in any number of rows and columns. Alternate embodiments of the present invention may use row decoder circuitry 64 instead of column decode/block select circuitry 66 to provide the block select signals to erase circuitry 62.

In alternate embodiments of the present invention, a block 50–57 may include only a portion of a row. For example, source conductor 148 in FIG. 3 may be coupled to a portion of the memory cells 100–102 in row M, rather than being coupled to all of the memory cells 100–102 in row M. The remaining memory cells in row M may thus be coupled to a different source conductor and may thus be part of a different block 50–57. Alternately, a source conductor may be coupled to a portion of the memory cells in more than one row. For example, in an alternate embodiment of the present invention, source conductor 148 in FIG. 3 may be coupled to a portion of the memory cells 100–102 in row M, and may also be coupled to a portion of the memory cells 123–125 in row (M−1).

In alternate embodiments of the present invention any type of erase voltage driver circuit which provides the appropriate erase voltage to the block conductors 140–147 may be used. Charge pumps 80–87 which use capacitors 90–97 are one type of erase voltage driver circuit which may be used in the present invention. Alternate embodiments of the present invention may use other types of erase voltage driver circuits. Also, in alternate embodiments of the present invention, processing unit 12 may be implemented as a gate array.

It is to be understood, therefore, that this invention is not limited to the particular forms illustrated and that the appended claims cover all modifications that do not depart from the spirit and scope of this invention.

We claim:

1. An electrically erasable programmable read only memory (EEPROM), comprising:

a plurality of bit lines;
   an array of flash EEPROM memory cells, said array of flash EEPROM memory cells having a first block of flash EEPROM memory cells and a second block of flash EEPROM memory cells, the first block of flash EEPROM memory cells being coupled to the second block of flash EEPROM memory cells by way of said plurality of bit lines;
   a first charge pump circuit; and
   a second charge pump circuit;
   wherein the first block of flash EEPROM memory cells comprises:
      at least a portion of a first row;
      a first source conductor coupled to said at least the portion of the first row; and
      a first block conductor coupled to said first source conductor and to said first charge pump circuit; and
   wherein the second block of flash EEPROM memory cells comprises:
      at least a portion of a second row;
      a second source conductor coupled to said at least the portion of the second row; and
      a second block conductor coupled to said second source conductor and to said second charge pump circuit; and
   wherein said first block of flash EEPROM memory cells can be erased independently of said second block of flash EEPROM memory cells.

2. An electrically erasable programmable read only memory (EEPROM) as in claim 1, wherein said first charge pump comprises:

a first capacitor having a first predetermined capacitance value; and wherein said second charge pump comprises:

a second capacitor having a second predetermined capacitance value.

3. An electrically erasable programmable read only memory (EEPROM) as in claim 2, wherein said first and second predetermined capacitance values are selectively determined during manufacture of the electrically erasable programmable read only memory (EEPROM).

4. An electrically erasable programmable read only memory (EEPROM) as in claim 1, wherein the first block of flash EEPROM memory cells further comprises:

a first via for coupling said first block conductor to said first source conductor; and wherein the second block of flash EEPROM memory cells further comprises:

a second via for coupling said second block conductor to said second source conductor.

5. An electrically erasable programmable read only memory (EEPROM) as in claim 1, wherein the first block of flash EEPROM memory cells further comprises:

a third row; and
   a third source conductor coupled to said third row and coupled to said first block conductor; and wherein the second block of flash EEPROM memory cells further comprises:

a fourth row; and
   a fourth source conductor coupled to said fourth row and coupled to said second block conductor.

6. An electrically erasable programmable read only memory (EEPROM) as in claim 1, further comprising:

decode circuitry, coupled to said array of flash EEPROM memory cells, said decode circuitry asserting a first block select signal to select the first block of flash EEPROM memory cells during a first erase procedure, said decode circuitry asserting a second block select signal to select the second block of flash EEPROM memory cells during a second erase procedure.

7. An electrically erasable programmable read only memory (EEPROM) as in claim 6, wherein said decode circuitry provides a plurality of column select signals.

8. An electrically erasable programmable read only memory (EEPROM) as in claim 7, further comprising:
    row decode circuitry coupled to said array of flash EEPROM memory cells.

9. An electrically erasable programmable read only memory (EEPROM) as in claim 8, wherein said first charge pump circuit places a predetermined voltage level on said first block conductor during the first erase procedure, and wherein said second charge pump circuit places the predetermined voltage level on said second block conductor during the second erase procedure.

10. An electrically erasable programmable read only memory (EEPROM) as in claim 1, wherein the electrically erasable programmable read only memory (EEPROM) and a processing unit are located on a same integrated circuit.

11. A block erasable flash EEPROM memory, comprising:
    a decode circuit for receiving address signals and for providing a first block select signal and a second block select signal;
    a plurality of bit lines;
    an array of flash EEPROM memory cells coupled to said decode circuit, said array of flash EEPROM memory cells having a first block of flash EEPROM memory cells and a second block of flash EEPROM memory cells, the first block of flash EEPROM memory cells being coupled to the second block of flash EEPROM memory cells by way of said plurality of bit lines; and
    a plurality of charge pump circuits coupled to said decode circuit;
wherein the first block of flash EEPROM memory cells comprises:
    a first plurality of rows;
    a first plurality of source conductors, each of said first plurality of source conductors being coupled to at least one row of the first plurality of rows; and
    a first block conductor coupled to all of said first plurality of source conductors and coupled to a first one of said plurality of charge pump circuits; and
wherein the second block of flash EEPROM memory cells comprises:
    a second plurality of rows;
    a second plurality of source conductors, each of said second plurality of source conductors being coupled to at least one row of the second plurality of rows; and
    a second block conductor coupled to all of said second plurality of source conductors and coupled to a second one of said plurality of charge pump circuits; and
wherein said first block of flash EEPROM memory cells can be erased independently of said second block of flash EEPROM memory cells.

12. A block erasable flash EEPROM memory as in claim 11, wherein each of the plurality of charge pump circuits comprises:

a capacitor having a capacitance value; and
wherein the capacitance value of each capacitor is determined by way of a mask option during manufacture of the block erasable flash EEPROM memory.

13. A block erasable flash EEPROM memory as in claim 12, wherein the first plurality of rows is a first positive whole number which is determined by way of the mask option during manufacture of the block erasable flash EEPROM memory, and wherein the second plurality of rows is a second positive whole number which is determined by way of the mask option during manufacture of the block erasable flash EEPROM memory.

14. A method for operating a block erasable flash EEPROM memory having an array partitioned into at least a first block and a second block, the first block having a first number of rows and the second block having a second number of rows, the method comprising the steps of:
    selecting an electrical parameter of a first erase voltage driver circuit to have a first value;
    selecting the electrical parameter of a second erase voltage driver circuit to have a second value;
    receiving a plurality of address signals;
    decoding the plurality of address signals;
    determining, by way of the address signals, if the first block is to be erased;
    if the first block is to be erased, asserting a first block select signal;
    if the first block select signal is asserted, enabling the first erase voltage driver circuit to drive a first block conductor to an erase voltage to erase the first block;
    determining, by way of the address signals, if a second block is to be erased;
    if the second block is to be erased, asserting a second block select signal; and
    if the second block select signal is asserted, enabling the second erase voltage driver circuit to drive a second block conductor to the erase voltage to erase the second block.

15. A method for operating a block erasable flash EEPROM memory as in claim 14, further comprising the step of:
    determining if an erase initiation sequence has been completed.

16. A method for operating a block erasable flash EEPROM memory as in claim 14, further comprising the step of:
    selecting the first number of rows and the second number of rows as a mask option during manufacture of the block erasable flash EEPROM memory.

17. A method for operating a block erasable flash EEPROM memory as in claim 14, wherein the first erase voltage driver circuit is a first charge pump circuit, and the second erase voltage driver circuit is a second charge pump circuit.

18. A method for operating a block erasable flash EEPROM memory as in claim 17, wherein the electrical parameter is a capacitance parameter.

19. A method for operating a block erasable flash EEPROM memory as in claim 18, further comprising the step of:
    selecting the first value and the second value as a mask option during manufacture of the block erasable flash EEPROM memory.

20. A method for operating a block erasable flash EEPROM memory as in claim 19, further comprising the step of:
    selecting the first number of rows and the second number of rows by way of said mask option.

* * * * *